(12) United States Patent
Kerley et al.

(10) Patent No.: US 7,333,311 B2
(45) Date of Patent: Feb. 19, 2008

(54) METHOD AND STRUCTURE FOR AC COUPLED INSITU ESD PROTECTION

(75) Inventors: John C. Kerley, Elbert, CO (US); David D. Eskeldson, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 357 days.

(21) Appl. No.: 11/140,214

(22) Filed: May 27, 2005

(65) Prior Publication Data

US 2006/0268475 A1     Nov. 30, 2006

(51) Int. Cl.
*H02H 9/00*     (2006.01)
(52) U.S. Cl. ........................................................ 361/56
(58) Field of Classification Search ................ 361/56, 361/111
See application file for complete search history.

(56) References Cited

U.S. PATENT DOCUMENTS

| | | | |
|---|---|---|---|
| 6,580,591 B2* | 6/2003 | Landy | 361/56 |
| 6,724,592 B1* | 4/2004 | Tong et al. | 361/56 |
| 2004/0109271 A1* | 6/2004 | Takeda | 361/56 |

* cited by examiner

*Primary Examiner*—Michael Sherry
*Assistant Examiner*—Scott Bauer

(57) ABSTRACT

A structure and method operable to provide ESD protection for protected circuitry of automatic test equipment (ATE). In a disable mode, the first voltage potential and second voltage potential are substantially equivalent to the reference potential resulting in a clamping circuit providing a nominal clamping voltage to the protected circuit so that an ESD event having a voltage between the first voltage potential and the second voltage potential is shunted to the reference potential via first and second ESD rails, wherein the ESD event is received on a DUT node coupled to the one or more signal rails of the protected circuitry.

22 Claims, 11 Drawing Sheets

METHOD AND STRUCTURE FOR AC COUPLED INSITU ESD PROTECTION

BACKGROUND

Pin electronics (PE) circuitry that is incorporated within Automated Test Equipment (ATE) often needs to be protected from electrostatic discharge (ESD). Traditionally, PE circuitry, when inactive, has been protected from external overstress with mechanical relays. More recent ATE systems have been implemented with solid state relays or switches in order to save space, cost, power and to improve reliability. The use of solid state relays in an ATE architecture necessarily leaves the solid state relay physically connected to the external environment even when disabled. The relays will be open in the disabled state. By being open during user events, the relays protect the PE circuitry. However, to be open, the solid state relays must be powered up and still connected to the DUT node itself, thereby making the solid state relays themselves subject and vulnerable to ESD events. During this disabled state overstress ESD events can occur.

Not all ATE architectures without mechanical relays necessarily use solid state relays. With or without the use of solid state relays, it is possible for the PE circuitry to be physically connected to the external environment. Furthermore, users of ATE may not power down the ATE PE circuitry during typical disable modes, such as swapping out wafers/DUT's, because the overhead associated with powering back up, loading software, calibrating the system and waiting for temperature to stabilize, may be significant. Consequently, the ATE PE circuitry and the solid state relays may always be powered up during these disable modes. Thus, there is a need for enhanced overstress protection when in the disabled state and when the ATE may be drawing power.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION

Figure 1:
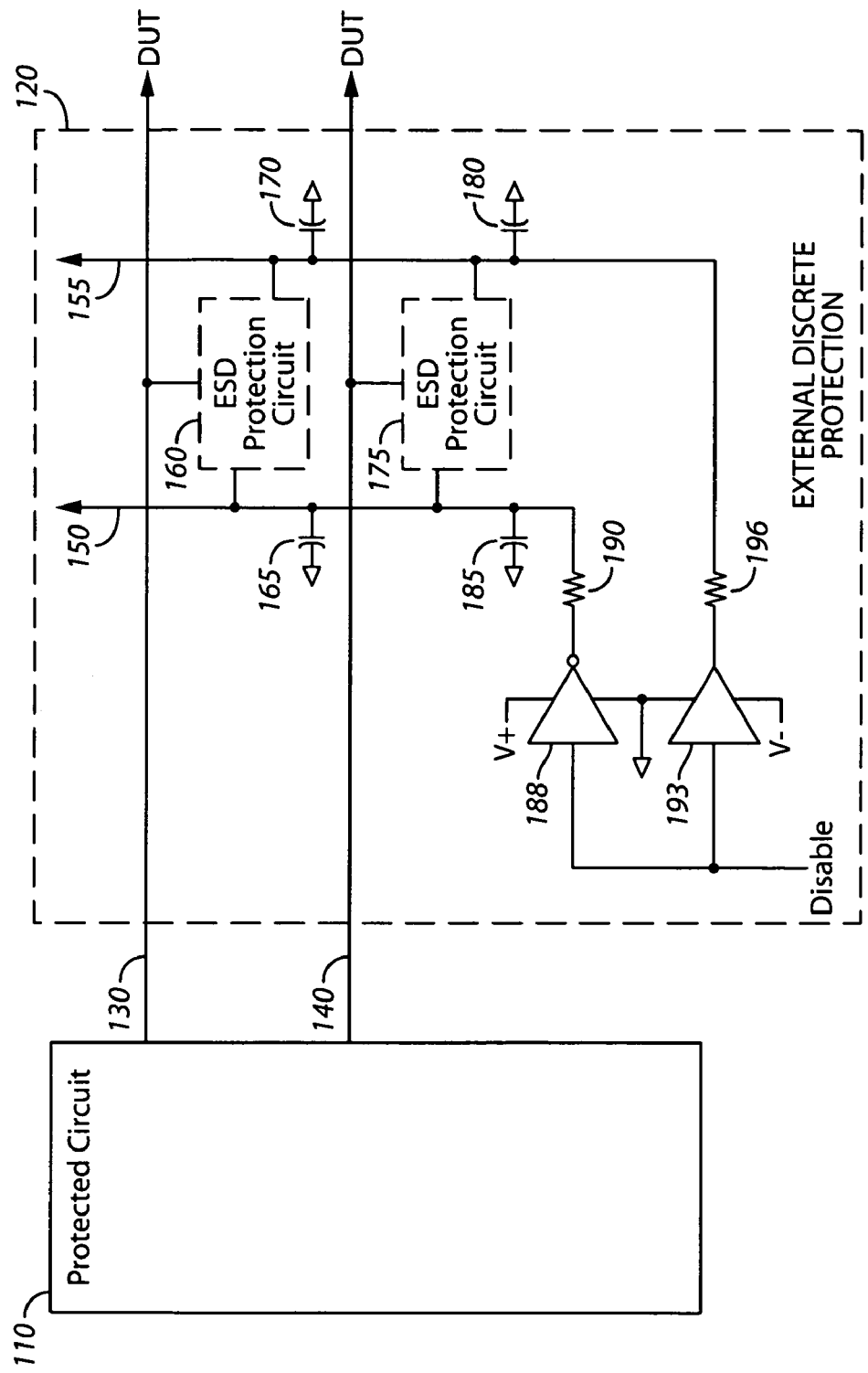
FIG. 1 is a diagram of an external discrete protection circuit, in accordance with certain embodiments of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Referring now to FIG. 1, a diagram of an external discrete protection circuit is shown, in accordance with certain embodiments of the present invention. Protected circuit 110 is coupled to a Device Under Test (DUT) node via signal rails 130 and 140. As used herein, signal rails may be used to supply voltages or signals, including digital or analog waveforms for instance, to and from circuitry of interest, such as pin electronics circuitry. Signal rails 130 and 140 are further coupled to external discrete protection 120. External Discrete protection 120 is coupled to ESD rails 150 and 155, and comprises ESD protection circuits 160 and 175. ESD rails are coupled to a plurality of capacitive elements 165, 170, 180, 185, and resistive elements 190, 196. The plurality of capacitive elements 165, 170, 180, 185 are further coupled to ground or a suitable reference potential. Resistive elements 190, 196 are further coupled to inverted buffer 188 and buffer 193. Inverted buffer 188 is coupled to a positive supply at a first terminal, coupled to ground at a second terminal, and coupled to a disable signal at a third terminal. Buffer 193 is coupled to a negative supply at a first terminal, coupled to ground at a second terminal, and coupled to the disable signal at a third terminal. In certain embodiments of the present invention, ground has a substantially zero potential. The buffers discussed herein may be operational amplifiers.

It is noted that ESD protection circuits 160 and 175 are operable to be used with programmable DC voltages. The ESD rails 150 and 155 can be pulled to suitable voltage levels so as not to interfere with operation of the DUT node during testing, but can also be pulled to appropriate voltage levels during the disable mode to provide additional protection. In certain embodiments of the present invention, ESD rails 150 and 155 are pulled to ground only when disable is asserted; when disable is not asserted, ESD rails 150 and 155 are pulled back up to V+ and V− via the resistors 190,196 and buffers 188,193. The ESD rails themselves are bypassed to ground when an ESD event occurs. In a disable mode, the positive potential and the negative potential are substantially equivalent to a ground potential resulting in the clamping circuit providing a nominal clamping voltage to the protected circuit for an ESD event having a voltage between the positive potential and the negative potential. The ESD event is received on a DUT node coupled to the one or more signal rails of the protected circuit.

Figure 2:
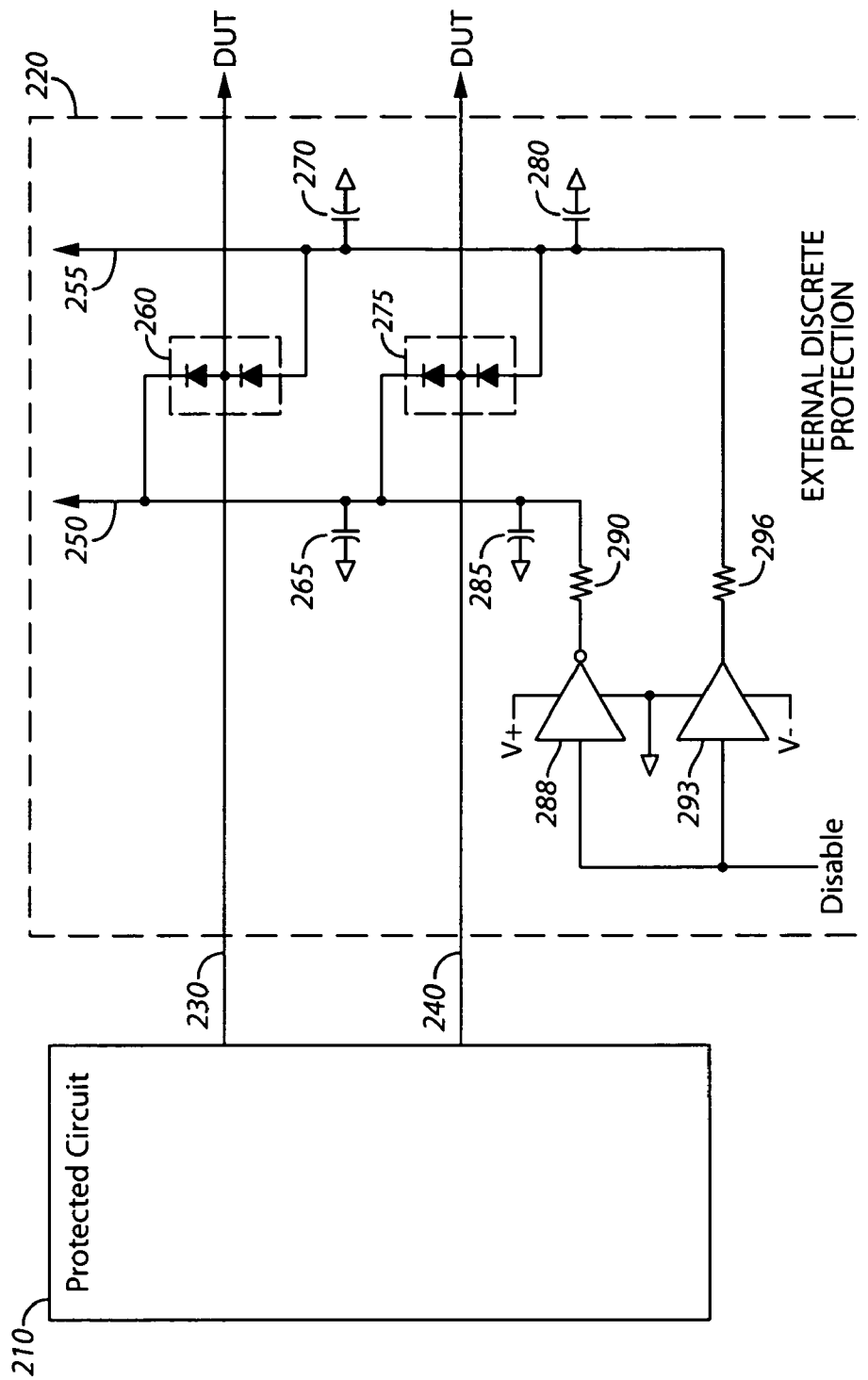
FIG. 2 is a diagram of an external discrete protection circuit that uses diode chains, in accordance with certain embodiments of the present invention.

Referring now to FIG. 2, a diagram of an external discrete protection circuit that uses diode chains is shown, in accordance with certain embodiments of the present invention. FIG. 2 is substantially similar to FIG. 3 except that ESD protection circuits 160 and 175 have been implemented using diode chains 260 and 275. It is noted that although only two diodes have been shown in diode chains 260 and 275, a different number of diodes may be implemented without departing from the spirit and scope of the present invention. It is further noted that pn diodes, Schottky diodes, Zener diodes or any other device with similar electrical behavior may be used. Diode chains 260 and 275 may be programmed to use any DC voltage.

Figure 3:
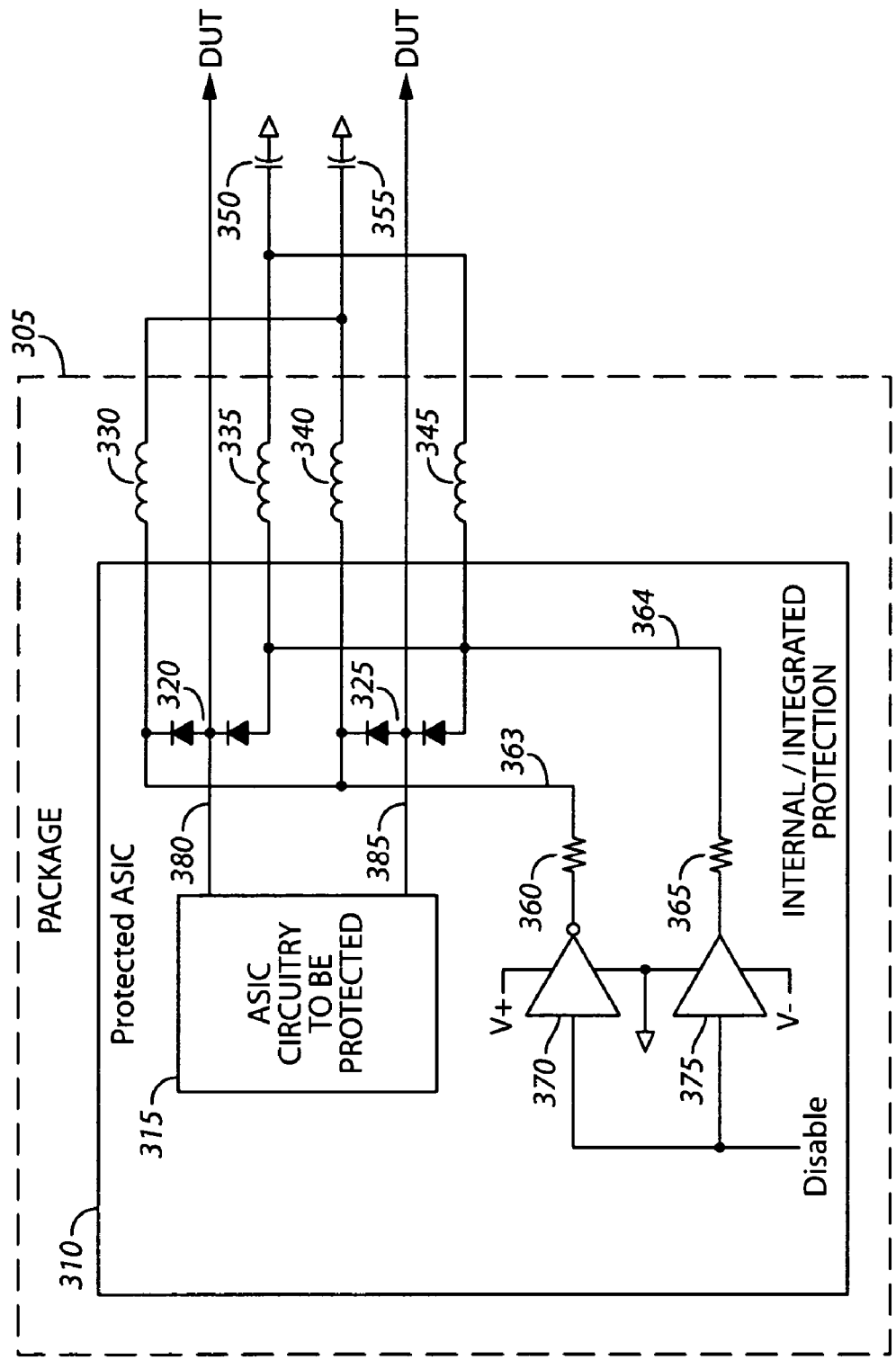
FIG. 3 is a diagram of an internal discrete protection circuit that uses diode chains, in accordance with certain embodiments of the present invention.

Referring now to FIG. 3, a diagram of an internal discrete protection circuit 300 that uses diode chains is shown, in accordance with certain embodiments of the present invention. Package 305 comprises protected ASIC 310, wherein protected ASIC 310 further comprises ASIC circuitry 315 that is protected by internal discrete protection 300. ASIC circuitry 315 is coupled to a DUT node via signal rails 380 and 385. ESD rails 363 and 364 are coupled to diode chains 320 and 325 respectively. Diode chain 320 is coupled to signal rail 380 between first and second diode of diode chain 320. Diode chain 325 is coupled to signal rail 385 between first and second diode of diode chain 325. ESD rail 363 is further coupled to resistive element 360 at a first terminal, while resistive element 360 is coupled to inverted buffer 370 at a second terminal. ESD rail 364 is further coupled to resistive element 365 at a first terminal, while resistive element 365 is coupled to buffer 375 at a second terminal. Inverted buffer 370 is coupled to a positive supply at a first terminal, coupled to ground at a second terminal, and coupled to a disable signal at a third terminal. Buffer 375 is coupled to a negative supply at a first terminal, coupled to ground at a second terminal, and coupled to the disable signal at a third terminal. The first terminal of resistive element 360 and the first diode of diode chain 320 is coupled to inductive element 330. Inductive element 330 is further coupled to a first terminal of capacitive element 355. A second terminal of capacitive element 355 is coupled to ground. The first terminal of resistive element 360 and the first diode of diode chain 325 is coupled to inductive element 340. Inductive element 340 is further coupled to a first terminal of capacitive element 355. A second terminal of capacitive element 355 is coupled to ground. The first terminal of resistive element 365 and the second diode of diode chain 320 is coupled to inductive element 335. Inductive element 335 is further coupled to a first terminal of capacitive element 350. A second terminal of capacitive element 350 is coupled to ground. The first terminal of resistive element 365 and the second diode of diode chain 325 is coupled to inductive element 345. Inductive element 345 is further coupled to a first terminal of capacitive element 350. In a disable mode, the first positive potential and the negative potential are substantially equivalent to a ground potential resulting in the clamping circuit providing a nominal clamping voltage to the protected circuit for an ESD event. The ESD event is received on a DUT node coupled to the one or more signal rails of the protected circuit.

Figure 4:
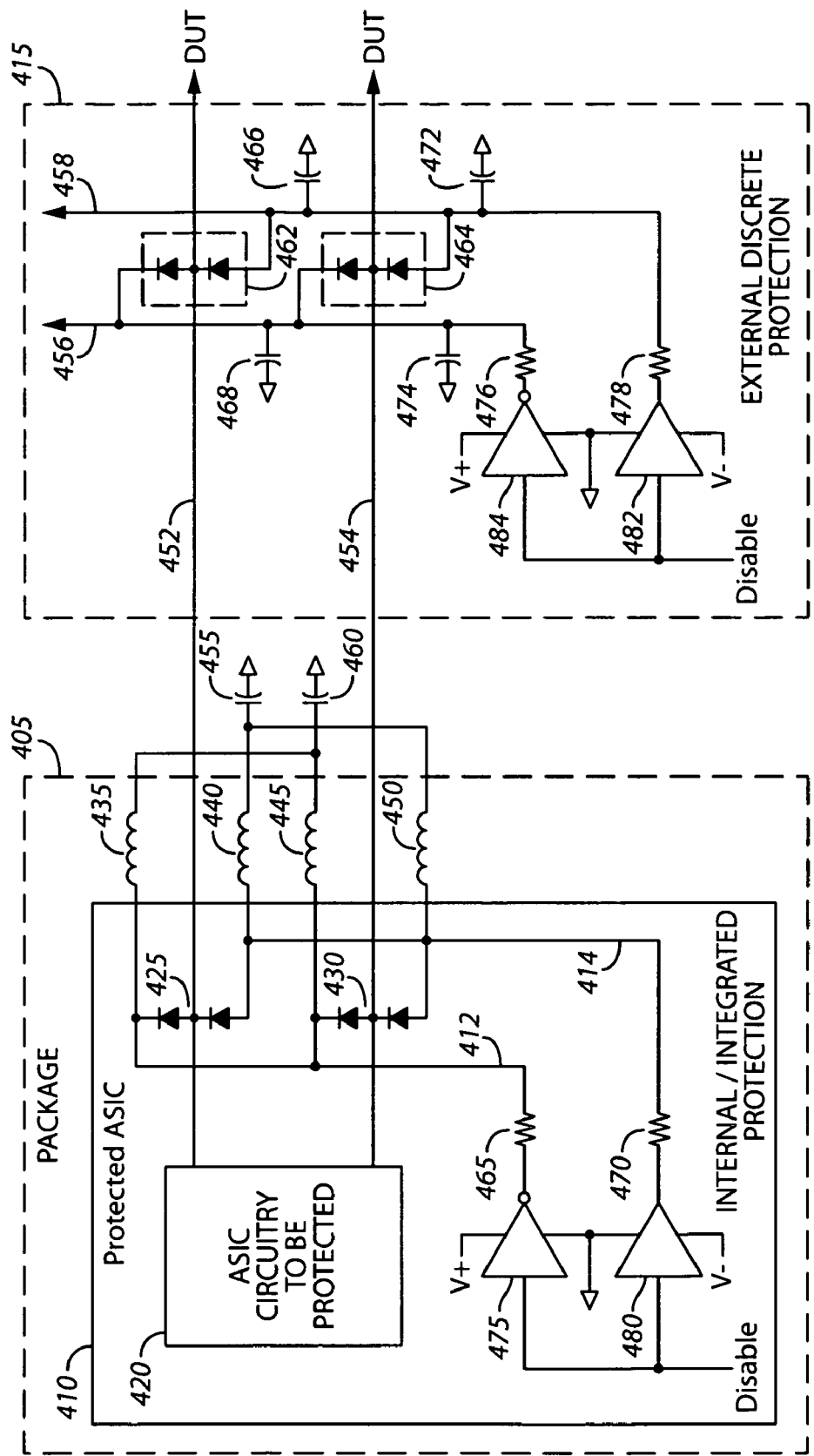
FIG. 4 is a diagram of an internal and external discrete protection circuit, in accordance with certain embodiments of the present invention.

Referring now to FIG. 4, a diagram of an internal and external discrete protection circuit is shown, in accordance with certain embodiments of the present invention. Package 405 comprises protected ASIC 410, wherein protected ASIC 410 further comprises ASIC circuitry 420 that is protected by internal discrete protection and external discrete protection 400. ASIC circuitry 420 is coupled to a DUT node via signal rails 452 and 454. ESD rails 412 and 414 are coupled to diode chains 425 and 430 respectively. Diode chain 425 is coupled to signal rail 452 between first and second diode of diode chain 425. Diode chain 430 is coupled to signal rail 454 between first and second diode of diode chain 430. ESD rail 412 is further coupled to resistive element 465 at a first terminal, while resistive element 465 is coupled to inverted buffer 475 at a second terminal. ESD rail 414 is further coupled to resistive element 470 at a first terminal, while resistive element 470 is coupled to buffer 480 at a second terminal. Inverted buffer 475 is coupled to a positive supply at a first terminal, coupled to ground at a second terminal, and coupled to a disable signal at a third terminal. Buffer 480 is coupled to a negative supply at a first terminal, coupled to ground at a second terminal, and coupled to the disable signal at a third terminal. The first terminal of resistive element 465 and the first diode of diode chain 425 is coupled to inductive element 435. Inductive element 435 is further coupled to a first terminal of capacitive element 460. A second terminal of capacitive element 460 is coupled to ground. The first terminal of resistive element 470 and the second diode of diode chain 425 is coupled to inductive element 440. Inductive element 440 is further coupled to a first terminal of capacitive element 455. A second terminal of capacitive element 455 is coupled to ground. The first terminal of resistive element 465 and the first diode of diode chain 430 is coupled to inductive element 445. Inductive element 445 is further coupled to a first terminal of capacitive element 460. The first terminal of resistive element 470 and the second diode of diode chain 430 is coupled to inductive element 450. Inductive element 450 is further coupled to a first terminal of capacitive element 455. In a disable mode, the first positive potential and the negative potential are substantially equivalent to a ground potential resulting in the clamping circuit providing a nominal clamping voltage to the protected circuit for an ESD event having a voltage between the positive potential and the negative potential. The ESD event is received on a DUT node coupled to the one or more signal rails of the protected circuit.

External discrete protected circuit is coupled to the DUT node via signal rails 452 and 454. Signal rails 452 and 454 are further coupled to external discrete protection 415. External Discrete protection 415 is coupled to ESD rails 452 and 454, and comprises ESD protection circuits 462 and 464. ESD rails are coupled to a plurality of capacitive elements 466, 468, 472, 474, and resistive elements 476, 478. The plurality of capacitive elements 466, 468, 472, 474 are further coupled to ground. Resistive elements 476, 478 are further coupled to inverted buffer 484 and buffer 482. Inverted buffer 484 is coupled to a positive supply at a first terminal, coupled to ground at a second terminal, and coupled to a disable signal at a third terminal. Buffer 482 is coupled to a negative supply at a first terminal, coupled to ground at a second terminal, and coupled to the disable signal at a third terminal.

It is noted that ESD protection circuits 462, 464, 425 and 430 are operable to be used with differing DC voltages. The ESD rails 452, 454, 412 and 414 can be pulled to suitable voltage levels so as not to interfere with operation of the DUT node during testing, but can also be pulled to appropriate voltage levels during disable mode to provide additional protection. The ESD rails 412, 414, 452, and 454 themselves are bypassed to ground when an ESD event occurs.

Figure 5:
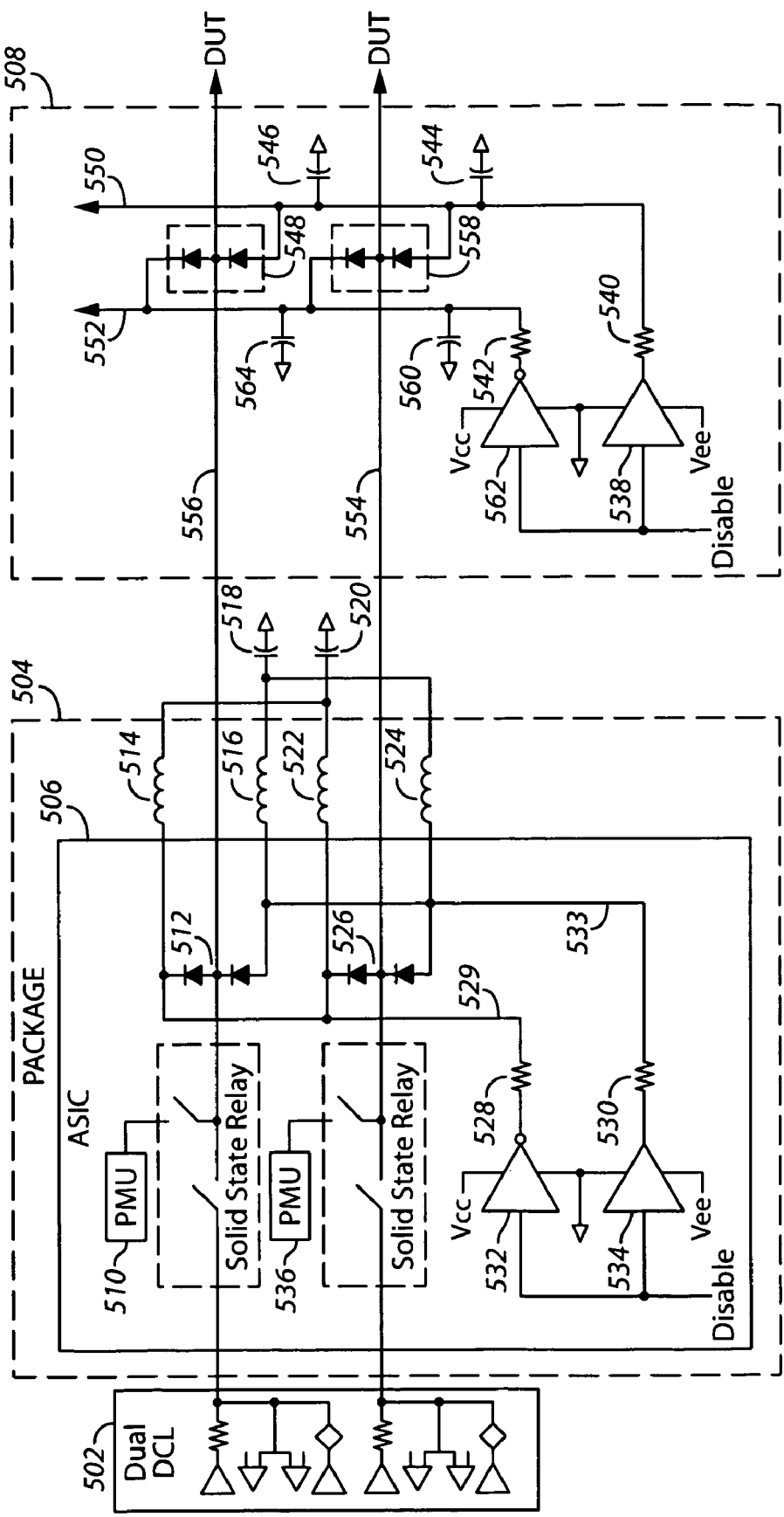
FIG. 5 is a diagram of an internal and external discrete protection circuit also comprising a dual DCL, in accordance with certain embodiments of the present invention.

Referring now to FIG. 5, a diagram of an internal and external discrete protection circuit 500 comprising a dual driver comparator-load (DCL) 502, in accordance with certain embodiments of the present invention. Package 504 comprises protected ASIC 506, wherein protected ASIC 506 further comprises Parameter Measurement Unit (PMU) 510 and PMU 536 that are protected by internal discrete protection and external discrete protection 500. PMU 510 is coupled to the DUT node via signal rail 556 and PMU 536 is coupled to the DUT node via signal rail 554. ESD rails 529 and 533 are coupled to diode chains 526 and 512 respectively. Diode chain 512 is coupled to signal rail 556 between first and second diode of diode chain 512. Diode chain 526 is coupled to signal rail 554 between first and second diode of diode chain 526. ESD rail 529 is further coupled to resistive element 528 at a first terminal, while resistive element 528 is coupled to inverted buffer 532 at a second terminal. ESD rail 533 is further coupled to resistive element 530 at a first terminal, while resistive element 530 is coupled to buffer 534 at a second terminal. Inverted buffer 532 is coupled to a positive supply at a first terminal, coupled to ground at a second terminal, and coupled to a disable signal at a third terminal. Buffer 534 is coupled to a negative supply at a first terminal, coupled to ground at a second terminal, and coupled to the disable signal at a third terminal. The first terminal of resistive element 528 and the first diode of diode chain 512 is coupled to inductive element 514. Inductive element 514 is further coupled to a first terminal of capacitive element 520. A second terminal of capacitive element 520 is coupled to ground. The first terminal of resistive element 528 and the first diode of diode chain 526 is coupled to inductive element 522. Inductive element 522 is further coupled to a first terminal of capacitive element 520. A second terminal of capacitive element 520 is coupled to ground. The first terminal of resistive element 530 and the second diode of diode chain 512 is coupled to inductive element 516. Inductive element 516 is further coupled to a first terminal of capacitive element 518. The first terminal of resistive element 530 and the second diode of diode chain 526 is coupled to inductive element 524. Inductive element 524 is further coupled to a first terminal of capacitive element 518. A second terminal of capacitive element 518 is coupled to ground.

External discrete protected circuit is coupled to the DUT node via signal rails 556 and 554. Signal rails 556 and 554 are further coupled to external discrete protection 508. External Discrete protection 508 is coupled to ESD rails 552 and 550, and comprises ESD protection circuits 548 and 558. ESD rail 552 is coupled to a plurality of capacitive elements 564, 560, and coupled to resistive element 542 at a first terminal. ESD rail 550 is coupled to a plurality of capacitive elements 544, 546, and coupled to resistive element 540 at a first terminal. The plurality of capacitive elements 560, 544, 546, 564 are further coupled to ground. Resistive element 542 is further coupled to inverted buffer 562 at a second terminal and resistive element 540 is further coupled to buffer 538 at a second terminal. Inverted buffer 562 is coupled to a positive supply at a first terminal, coupled to ground at a second terminal, and coupled to a disable signal at a third terminal. Buffer 538 is coupled to a negative supply at a first terminal, coupled to ground at a second terminal, and coupled to the disable signal at a third terminal.

Figure 6:
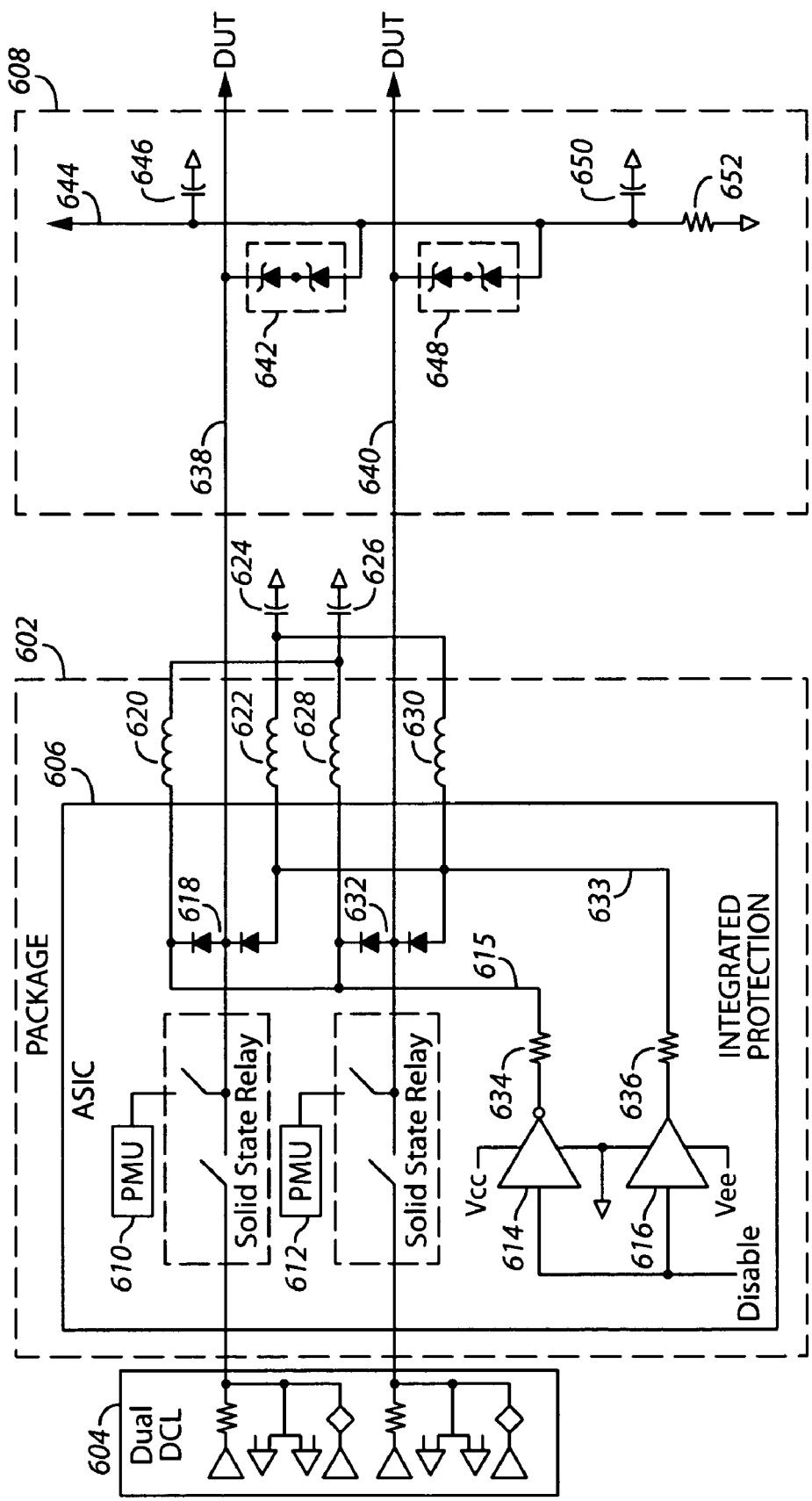
FIG. 6 is a diagram of an internal and external discrete protection circuit also comprising a dual DCL and uses Schottky diode chains, in accordance with certain embodiments of the present invention.

Referring now to FIG. 6, a diagram of an internal and external discrete protection circuit 600 also comprising a dual DCL (driver-comparator-load) and using Schottky diode chains is shown, in accordance with certain embodiments of the present invention. The dual DCL is one example of pin electronics (PE). In certain embodiments of the present invention, the pin electronics remain powered up while the DUT is changed. It is noted that, as used herein, the term "accessing" a DUT encompasses any change out of the DUT, including removing, swapping out, or inserting, etc. the DUT.

Package 602 comprises protected ASIC 606, wherein protected ASIC 606 further comprises Parameter Measurement Unit (PMU) 610 and PMU 612 that are protected by internal discrete protection and external discrete protection 600. PMU 610 is coupled to the DUT node via signal rail 638 and PMU 612 is coupled to the DUT node via signal rail 640. ESD rails 615 and 633 are coupled to diode chains 618 and 632 respectively. Diode chain 618 is coupled to signal rail 638 between first and second diode of diode chain 618. Diode chain 632 is coupled to signal rail 640 between first and second diode of diode chain 632. ESD rail 615 is further coupled to resistive element 634 at a first terminal, while resistive element 634 is coupled to inverted buffer 614 at a second terminal. ESD rail 633 is further coupled to resistive element 636 at a first terminal, while resistive element 636 is coupled to buffer 616 at a second terminal. Inverted buffer 614 is coupled to a positive supply at a first terminal, coupled to ground at a second terminal, and coupled to a disable signal at a third terminal. Buffer 616 is coupled to a negative supply at a first terminal, coupled to ground at a second terminal, and coupled to the disable signal at a third terminal. The first terminal of resistive element 634 and the first diode of diode chain 618 is coupled to inductive element 620. Inductive element 620 is further coupled to a first terminal of capacitive element 626. A second terminal of capacitive element 626 is coupled to ground. The first terminal of resistive element 634 and the first diode of diode chain 632 is coupled to inductive element 628. Inductive element 628 is further coupled to a first terminal of capacitive element 626. A second terminal of capacitive element 626 is coupled to ground. The first terminal of resistive element 636 and the second diode of diode chain 618 is coupled to inductive element 622. Inductive element 622 is further coupled to a first terminal of capacitive element 624. The first terminal of resistive element 636 and the second diode of diode chain 632 is coupled to inductive element 630. Inductive element 630 is further coupled to a first terminal of capacitive element 624. A second terminal of capacitive element 624 is coupled to ground.

External discrete protected circuit 608 is coupled to the DUT node via signal rails 638 and 640. Signal rails 638 and 640 are further coupled to external discrete protection 608. External Discrete protection 608 is coupled to ESD rails 644, and comprises ESD protection circuits 642 and 648. ESD rail 644 is coupled to a plurality of capacitive elements 646, 650, and coupled to resistive element 652 at a first terminal. The plurality of capacitive elements 646, 650 are further coupled to ground. Resistive element 652 is coupled to ground at a second terminal. ESD protection circuit 642 further comprises a zener diode chain wherein a first diode is coupled to signal rail 638 and a second zener diode is coupled to signal rail 640. ESD protection circuit 648 further comprises a zener diode chain wherein a first diode is coupled to signal rail 638 and a second zener diode is coupled to signal rail 640. It is noted that in certain embodiments, Schottky diodes could be used without departing from the spirit and scope of the present invention.

It is noted that the resistance values, inductance values and capacitance values illustrated in FIG. 5 and FIG. 6 should not be limiting, since other values of capacitance, resistance and inductance could be used without departing from the spirit and scope of the present invention.

Figure 7:
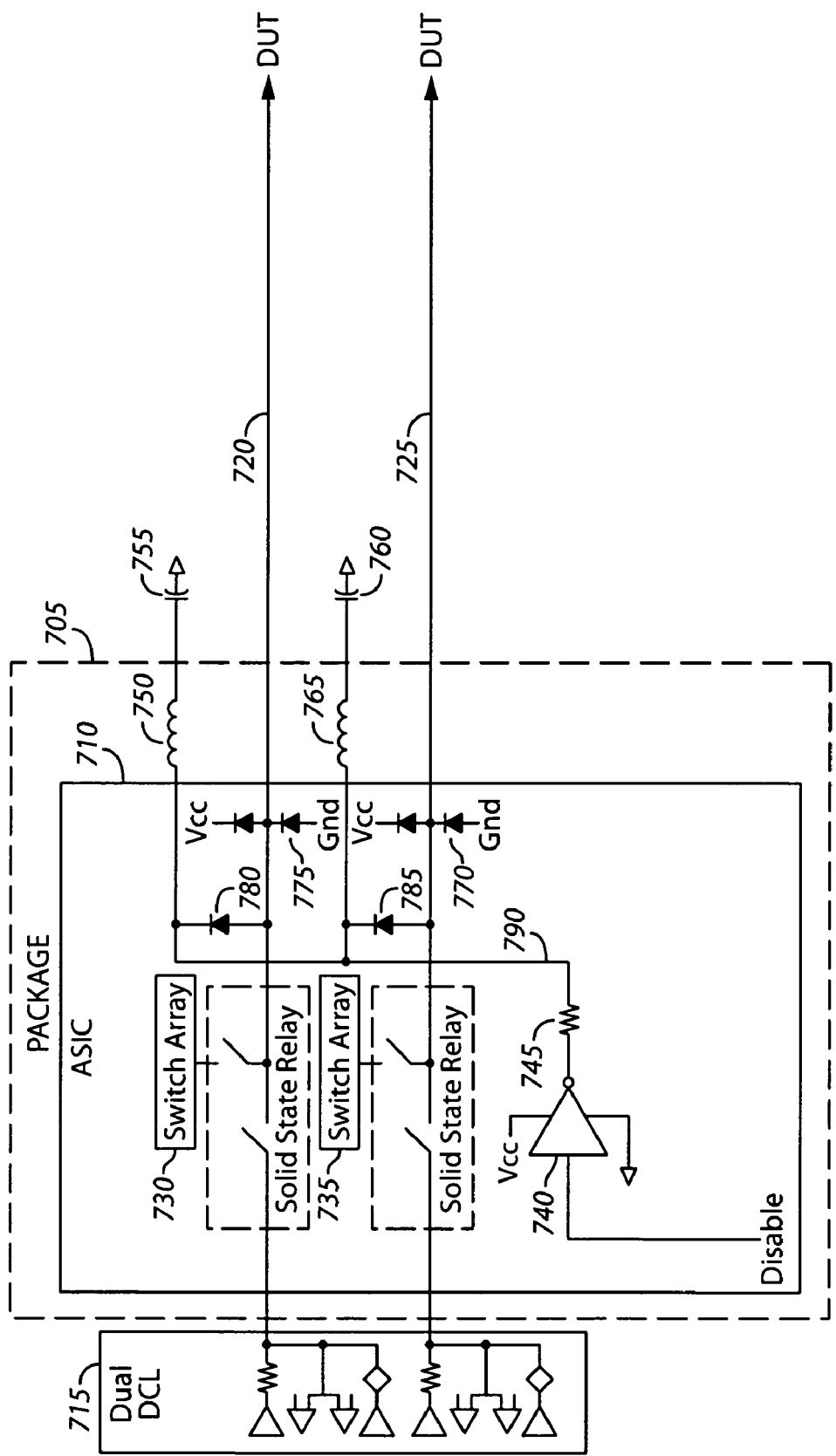
FIG. 7 is a diagram of an internal discrete protection circuit that uses diode chains where the negative voltage is close to a reference potential, in accordance with certain embodiments of the present invention.

Referring now to FIG. 7, a diagram of an internal discrete protection circuit 700 that uses diode chains where the negative voltage is close to ground is shown, in accordance with certain embodiments of the present invention. Package 705 comprises protected circuitry 710, wherein protected circuitry 710 further comprises switch arrays 730 and 735 that are protected by internal discrete protection 800. Switch arrays 730 and 735 are operable to be coupled to a DUT node via signal rails 720 and 725. ESD rail 790 is coupled to diode 780 and 785 respectively. Diode 780 is coupled to signal rail 720. Diode 785 is coupled to signal rail 725. ESD rail 790 is further coupled to inductive element 750 at a first terminal, while inductive element 750 is coupled to capacitive element 755 at a second terminal. Capacitive element 755 is coupled to ground at a second terminal. ESD rail 790 is further coupled to inductive element 765 at a first terminal, while inductive element 765 is coupled to capacitive element 760 at a second terminal. Capacitive element 760 is coupled to ground at a second terminal. Signal rail 720 and signal rail 725 are coupled to supply voltages that are close to ground. ESD rail 790 is further coupled to a first terminal of resistive element 745, while a second terminal of resistive element 745 is coupled to inverted buffer 740. Inverted buffer 740 is coupled to potential Vcc at a first terminal, coupled to ground at a second terminal, and coupled to a disable signal at a third terminal.

Figure 8:
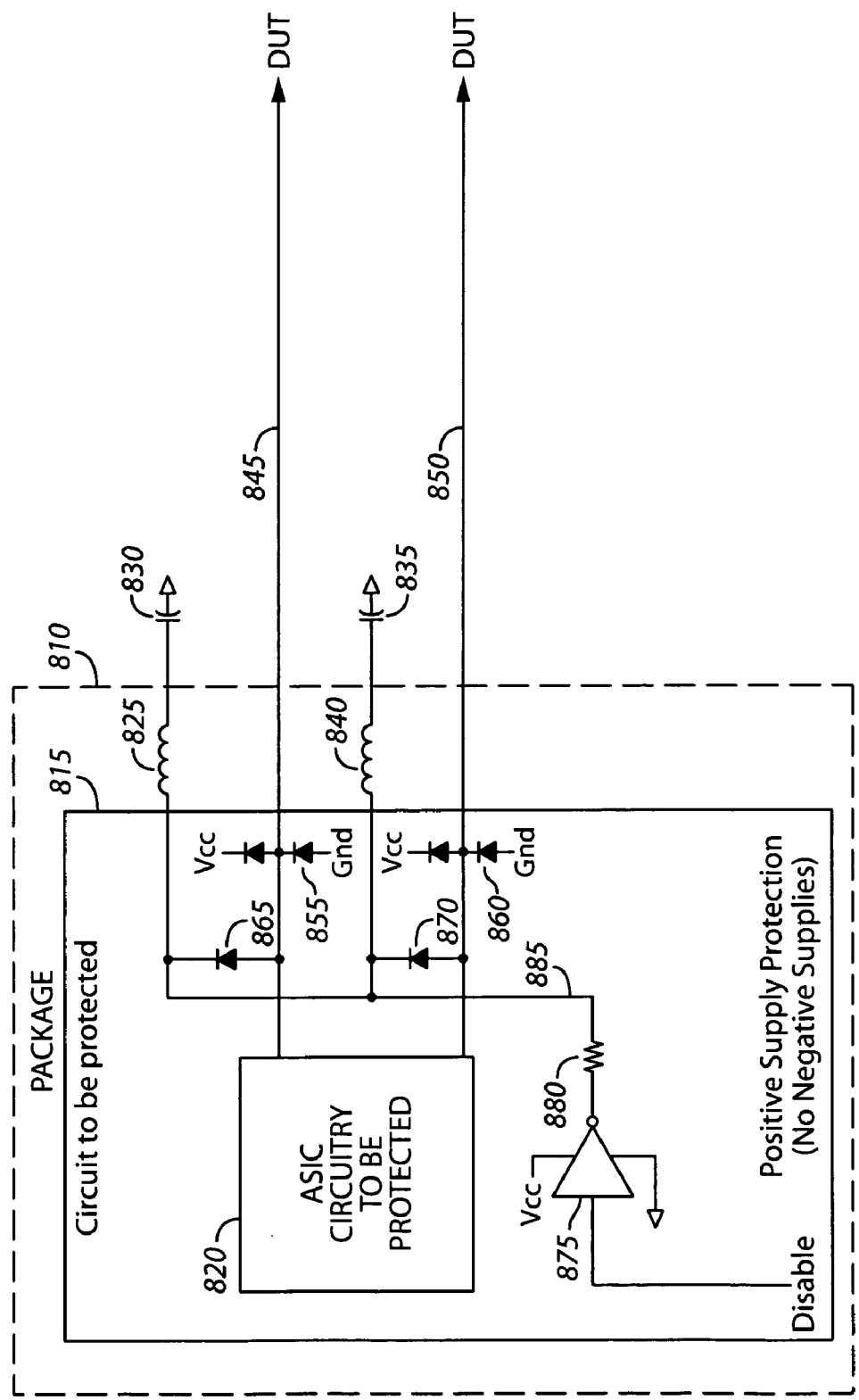
FIG. 8 is a diagram of an internal discrete protection circuit that uses only positive supply voltage, in accordance with certain embodiments of the present invention.

Referring now to FIG. 8 a diagram of an internal discrete protection circuit 800 that uses only positive supply voltage is shown, in accordance with certain embodiments of the present invention. Package 810 comprises protected circuitry 815, wherein protected circuitry 815 further comprises ASIC circuitry 820 that is protected by internal discrete protection 800. ASIC circuitry 820 is coupled to a DUT node via signal rails 845 and 850. ESD rail 885 are coupled to diode 865 and 870 respectively. Diode 865 is coupled to signal rail 845. Diode 870 is coupled to signal rail 850. ESD rail 885 is further coupled to resistive element 825 at a first terminal, while resistive element 825 is coupled to capacitive element 830 at a second terminal. Capacitive element 830 is coupled to ground at a second terminal. ESD rail 885 is further coupled to resistive element 840 at a first terminal, while resistive element 840 is coupled to capacitive element 835 at a second terminal. Capacitive element 835 is coupled to ground at a second terminal. Signal rail 845 and signal rail 850 are coupled to only non-negative supply voltages. ESD rail 885 is further coupled to a first terminal of resistive element 880, while a second terminal of resistive element 880 is coupled to inverted buffer 875. Inverted buffer 875 is coupled to potential Vcc at a first terminal, coupled to ground at a second terminal, and coupled to a disable signal at a third terminal.

Figure 9:
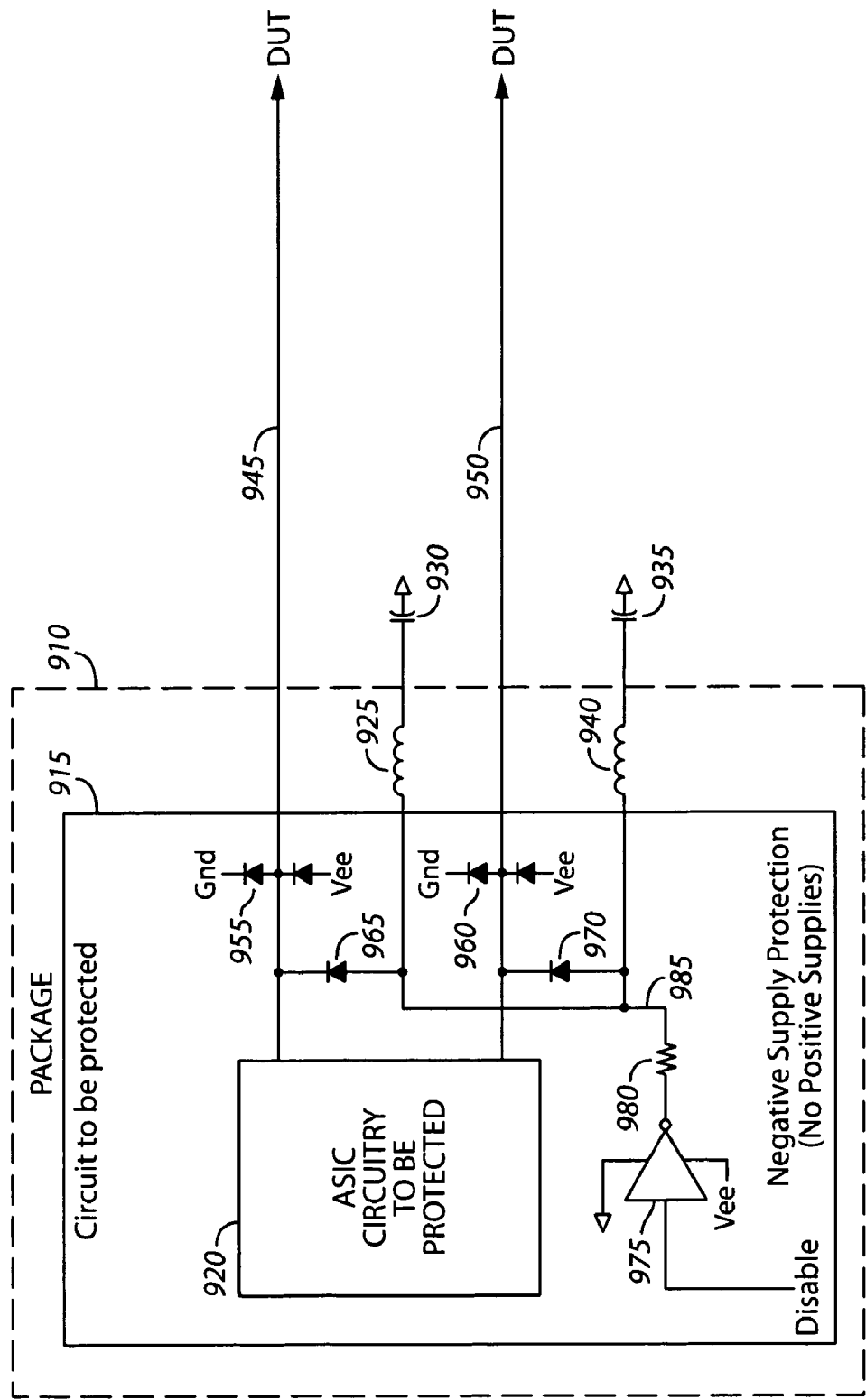
FIG. 9 is a diagram of an internal discrete protection circuit that uses only negative supply voltage, in accordance with certain embodiments of the present invention.

Referring now to FIG. 9 a diagram of an internal discrete protection circuit 900 that uses only negative supply voltage is shown, according to certain embodiments of the present invention. Internal discrete protection circuit 900 comprises protected circuitry 915, wherein protected circuitry 915 is located within package 910. Package 910 comprises ASIC circuitry 920 that is protected by internal discrete protection 900. ASIC circuitry 920 is coupled to a DUT node via signal rails 945 and 950. ESD rail 985 is coupled to diode 965 and 970 respectively. Diode 965 is coupled to signal rail 945. Diode 970 is coupled to signal rail 950. ESD rail 985 is further coupled to inductive element 925 at a first terminal, while inductive element 925 is coupled to capacitive element 930 at a second terminal. Capacitive element 930 is coupled to ground at a second terminal. ESD rail 985 is further coupled to inductive element 940 at a first terminal, while inductive element 940 is coupled to capacitive element 935 at a second terminal. Capacitive element 935 is coupled to ground at a second terminal. Signal rail 945 and signal rail 950 are coupled to only non-positive supply voltages. ESD rail 985 is further coupled to a first terminal of resistive element 980, while a second terminal of resistive element 980 is coupled to buffer 975. Inverted buffer 975 is coupled to potential Vee at a first terminal, coupled to ground at a second terminal, and coupled to a disable signal at a third terminal.

Figure 10:
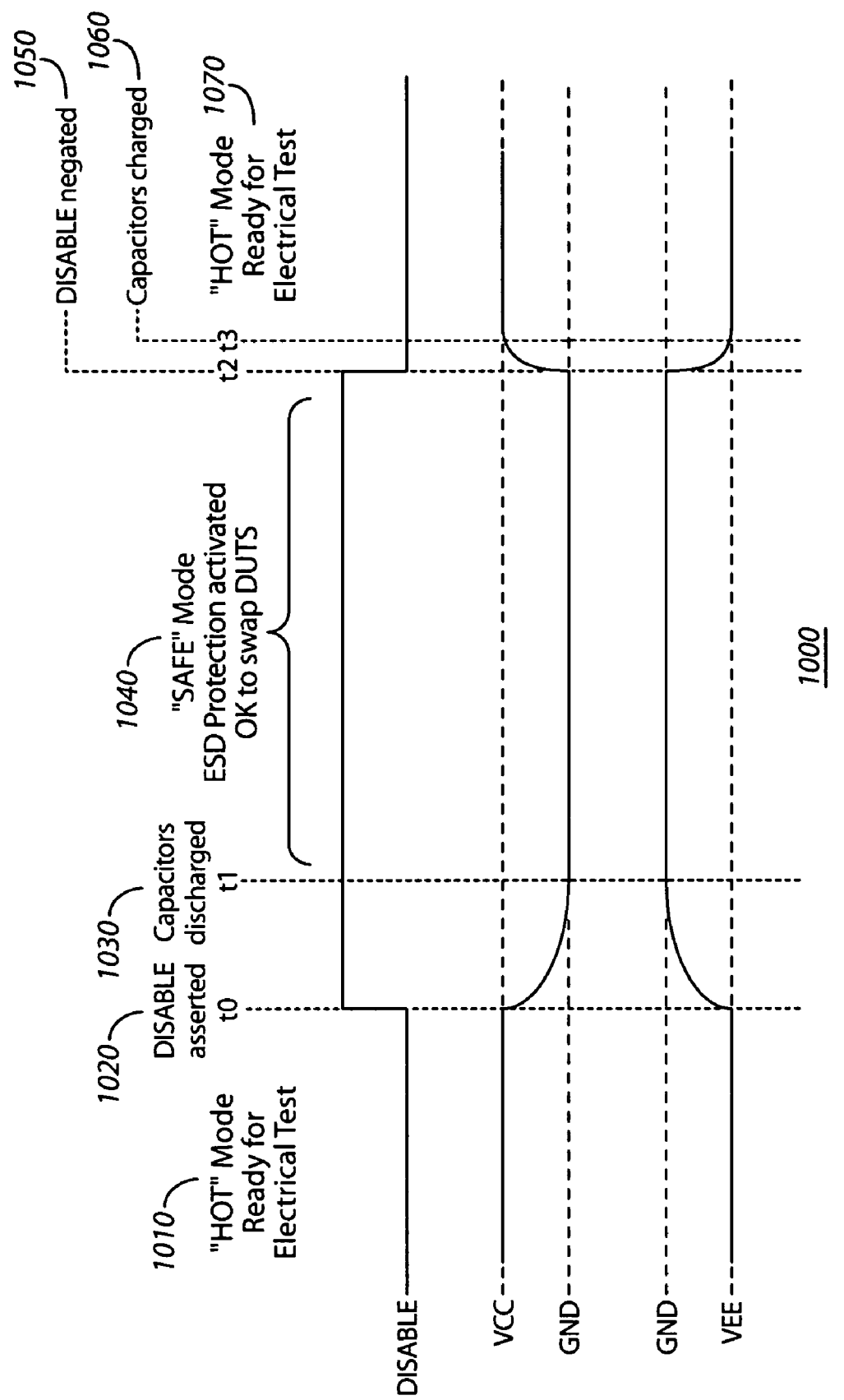
FIG. 10 is a timing diagram of an ESD protection circuit, in accordance with certain embodiments of the present invention.

Referring now to FIG. 10 a timing diagram 1000 of an ESD protection circuit is shown, according to certain embodiments of the present invention. During a hot mode, a DUT node is connected to protected circuitry useable for electrical testing. When a disable signal is asserted at time t0 (1020), capacitive elements of the ESD protection circuit are discharged at time t1 (1030), and the electrical testing enters a safe mode within which time it is possible to swap DUT nodes without damage occurring to protected circuitry (1040). After swapping DUT nodes the disable signal is negated at time t2 (1050), the capacitive elements are charged at time t3 (1060), and the DUT node is connected to the protected circuitry. Note that the disable signal is high from time t0 to t2, while the capacitive elements discharge between times t0 and t1, and the capacitive elements charge between times t2 and t3. The corresponding potentials Vcc and Vee are both pulled to ground. This sequence is represented in FIG. 12 as a flow diagram.

Figure 11:
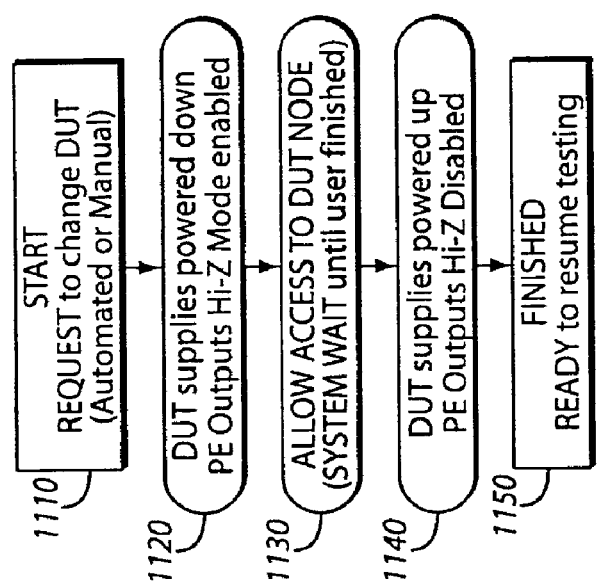
FIG. 11 is a flow diagram of an ESD protection circuit, in accordance with the prior art.

Referring now to FIG. 11 a flow diagram 1100 of an ESD protection circuit is shown, according to the prior art. A request to change out the DUT node is issued as in block 1110. The DUT power supply is powered down, and pin electronics enters a high impedance mode as in block 1120. The system then enables access to the DUT node and the testing system waits until the user is finished as in block 1130. The DUT power supply is then powered up and the high impedance mode is disabled as in block 1140. The system is then ready to resume testing (block 1150).

Automatic test equipment (ATE) systems have a method for receiving a request for disable mode—it's required so as to park all the PE circuitry and DUT power supplies (controlled by the ATE) into a safe mode. As described in the method of FIG. 12, the safe mode has further been expanded to pull the ESD rails to ground. In certain embodiments power is left on to the PE circuitry and solid state relays, which leaves them vulnerable to ESD events. When the disable mode is finished, such as when a user initiates a request to resume testing, the PE circuitry can be reprogrammed to appropriate levels, as well as the ESD rails reprogrammed to appropriate voltages to allow "normal" operation on the DUT node.

Figure 12:
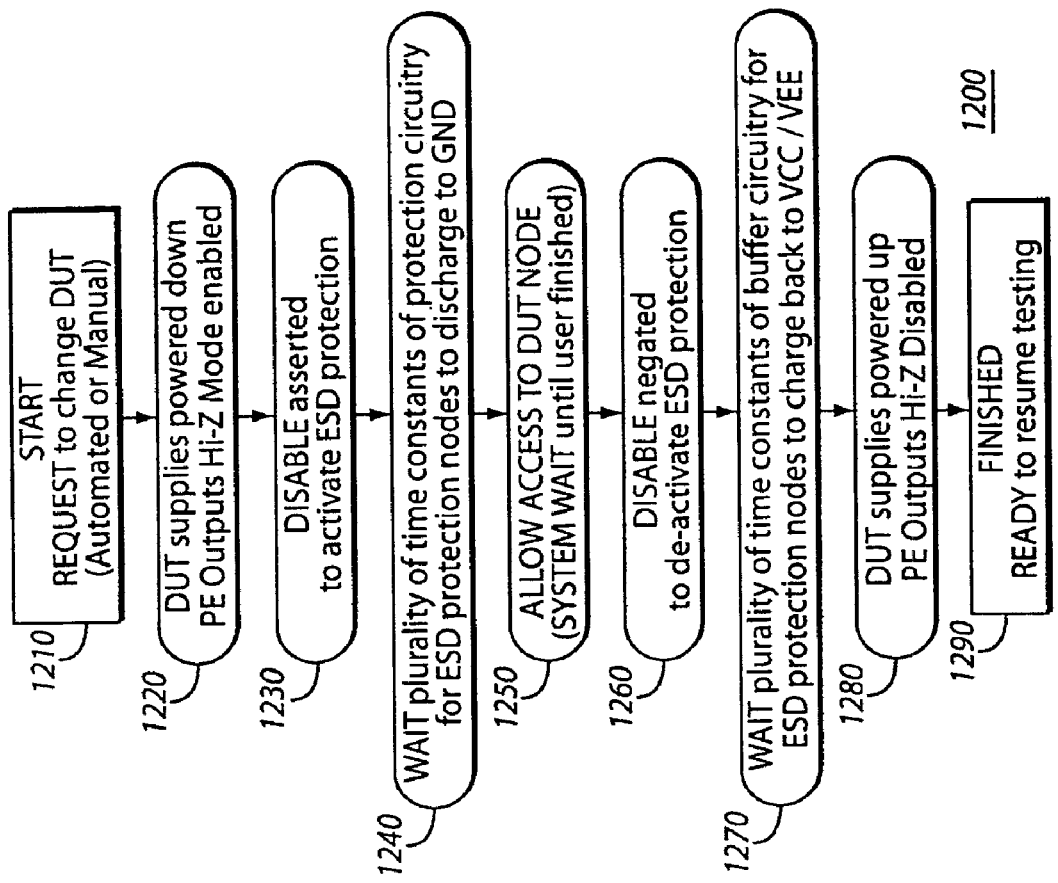
FIG. 12 is a flow diagram of an ESD protection circuit, in accordance with certain embodiments of the present invention.

Referring now to FIG. 12, a flow diagram 1200 of an ESD protection circuit is shown, in accordance with certain embodiments of the present invention. A request to change out the DUT is issued as in block 1210. The DUT power supply is powered down, and pin electronics enters a high impedance mode as in block 1220. The system then enables access to the DUT node and the testing system waits until the user is finished as in block 1130. While the DUT power supply is powered down, in the ATE environment the user may be engaged in any variety of activities, including, for example, swapping out the DUT itself, swapping the power supplies, the calibration systems, PC Board probe cards, wafers or packaged parts under test. The DUT power supply is then powered up and the high impedance mode is disabled as in block 1140. The system is then ready to resume testing (block 1150). It is noted that this flow diagram is applicable to any of the embodiments described in FIGS. 1-10.

FIGS. 1-9 illustrate internal and external structures for AC coupled ESD protection methods. In each case, the protection circuits (e.g., diode chains) employ an AC coupled, low impedance path for the ESD event discharge.

Because ESD events are transient, charge limited, and occur at a low duty cycle, the AC coupled clamps will work properly provided appropriate values of R and C are used. In certain embodiments of the present invention, the resistance and capacitance values illustrated in the figures are used although other values of R and C may be used without departing from the spirit and scope of the present invention. During normal operation when the protected circuitry is active, the disable signal is not asserted. The clamp anodes and cathodes are pulled to Vcc and Vee respectively. These voltages may simply be the signal rails of the protected ASIC or levels less than the supplies that still allow proper functioning of a signal path to the DUT node. The latter case provides additional protection. The internal protection clamps present only capacitive loading as would ordinary ESD clamp diodes on a die pad. The capacitive loading of the external discrete clamp diodes may be compensated if necessary. During a disabled state, the clamp anodes and cathodes are all pulled to AC ground. This results in several distinct advantages. First, the clamping level is ground for both positive and negative ESD events. This is an improvement that reduces the peak voltage that would appear at the protected circuitry versus clamping with respect to the ASIC signal rails, as would be the case for a conventional ESD clamp arrangement. Secondly, this clamping arrangement controls a disabled usually high impedance DUT node to within one diode drop of ground which prevents drift due to leakage currents. Third, the RC impedance holding the clamps to ground prevents an external DC source from damaging the clamp diodes. The clamp diodes are free to track any DC voltage provided it remains within the signal rails. Note that is impractical to use DC coupled clamps to protect the DUT node against DC sources. The finite resistance, R, in series with the buffers presetting the level on the external capacitors limits the current in the buffer outputs during an ESD event. Care must be taken to provide a low inductance path to the capacitive C elements. Prior solutions generally employ some type of shunt clamp device as well, but do not incorporate the variable clamp levels employed in the present method. Usually, such clamp devices utilize special devices or materials that are not available for an integrated solution. The method described will work with the standard ESD clamp diodes generally available in any ASIC process. This is important, as the application may require or allow the use of the integrated implementation. Additionally, if an external implementation is feasible, using both integrated and external clamps together has been shown to significantly improve ESD protection in real tests primarily due to current sharing, the lower achieved path conductance of the external clamp, and the physical separation of the two clamps.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A clamping circuit operable to provide ESD protection for protected circuitry of automatic test equipment (ATE), comprising:
    a first ESD rail and a second ESD rail comprising a corresponding first voltage potential and second voltage potential, wherein one or more signal rails of the protected circuitry are operable to be coupled to the first ESD rail and to the second ESD rail, and the first ESD rail and the second ESD rail are AC coupled to a reference potential;
    a first one or more capacitive elements coupled in parallel to the first ESD rail;
    a second one or more capacitive elements coupled in parallel to the second ESD rail;
    a first one or more resistive elements coupled in series to the first ESD rail;
    a second one or more resistive elements coupled in series to the second ESD rail; and
    one or more ESD devices coupled to the first ESD rail, coupled to the second ESD rail and coupled to the corresponding one or more signal rails,
    wherein in a disable mode, the first voltage potential and the second voltage potential are substantially equivalent to the reference potential resulting in the clamping circuit providing a nominal clamping voltage to the protected circuit so that an ESD event having a voltage between the first voltage potential and the second voltage potential is shunted to the reference potential via the first and second ESD rails, wherein the ESD event is received on a device under test (DUT) node coupled to the one or more signal rails of the protected circuit.

2. The clamping circuit of claim 1, wherein the protected circuitry is an application specific integrated circuit (ASIC).

3. The clamping circuit of claim 1, wherein one or more of the first one or more and the second one or more capacitive elements are compensated.

4. The clamping circuit of claim 1, wherein the first voltage potential and the second voltage potential have the same polarity referenced to the reference potential.

5. The clamping circuit of claim 1, wherein when a disable signal is low, an anode of the clamping circuit is pulled to the first voltage potential and the cathode is pulled to the second voltage potential and when the disable signal is high, the anode and cathode of the clamping circuit are both pulled to the reference potential.

6. The clamping circuit of claim 1, wherein the clamping circuit resides internally to the protected circuit.

7. The clamping circuit of claim 1, wherein the first one or more capacitive elements and the second one or more capacitive elements are in parallel with the corresponding first ESD rail and the second ESD rail.

8. The clamping circuit of claim 1, where an ESD device of the one or more ESD devices is a diode chain.

9. The clamping circuit of claim 8, wherein a plurality of diodes in the diode chain are one or more of zener diodes and Schottky diodes.

10. The clamping circuit of claim 8, wherein the number of diodes in each diode chain is two.

11. The clamping circuit of claim 1, wherein the clamping circuit is coupled to a disable switch, further comprising:
a first buffer coupled to the first ESD rail at a first terminal;
a second buffer coupled to the second ESD rail at a second terminal, wherein the first operational amplifier and the second operational amplifier are further coupled to an enable signal at a third terminal and coupled to the reference potential at a fourth terminal and wherein the first operational amplifier is coupled to a first voltage potential at a fifth terminal and the second operational amplifier is coupled to a second voltage potential at a sixth terminal.

12. The clamping circuit of claim 1, wherein the one or more capacitive elements of the internal ESD protection circuit are external to the package.

13. A system operable to provide overstress protection for automatic test equipment, comprising:
a package comprising a protected application specific integrated circuit (ASIC);
one or more of an internal ESD protection circuit coupled to the protected ASIC internally and an external ESD protection circuit coupled to the protected ASIC externally, said internal ESD protection circuit and said external ESD protection circuit operable to be coupled to a device under test (DUT) and operable to be AC coupled to a reference potential; and
one or more signal rails of the protected ASIC, said signal rails coupled to the internal ESD protection circuit and coupled to the external ESD protection circuit,
wherein when the protected ASIC is in a disabled mode an ESD event receivable on the one or more signal rails is shunted to the reference potential via one or more of the internal ESD protection circuit and the external ESD protection circuit, said ESD event having a voltage between a first voltage and a second voltage of the one or more signal rails.

14. The system of claim 13, wherein one or more of the external ESD protection circuit and the internal ESD protection circuit comprises:
one or more ESD rails;
one or more capacitive elements coupled to the one or more ESD rails;
one or more resistive elements coupled to the one or more ESD rails; and
one or more diode chains wherein each diode chain is coupled at a first terminal to a first ESD rail of the one or more ESD rails, coupled at a second terminal to a second ESD rail of the one or more ESD rails, and operable to be coupled at a third terminal to the signal rail of the protected device.

15. The system of claim 14, wherein the one or more capacitive elements of the internal ESD protection circuit are external to the package.

16. The system of claim 13, wherein the protected ASIC is further coupled to a dual DCL.

17. A method for providing a protected circuit within an automated test equipment protection from electro static discharge (ESD) events, said method comprising:
in response to receiving an indication of a disable mode, causing first and second ESD rails of a clamping circuit to be pulled to a reference potential, wherein said first and second ESD rails are AC coupled to the reference potential and one or more signal rails are coupled to a device under test (DUT); and
the clamping circuit providing a nominal clamping voltage level to the protected circuit for an ESD event received on one or more signal rails of the protected circuit so that the ESD event is shunted to the reference potential via the first and second ESD rails which are AC coupled to the reference potential.

18. The method of claim 17, wherein the protection is internal to the protected circuit and external to the protected circuit and wherein the protected circuit is powered up.

19. The method of claim 17, wherein the first and second ESD rails have a first voltage potential and a second voltage potential, wherein the first voltage potential and the second voltage potential have the same polarity referenced to the reference potential.

20. A method for providing a protected circuit within an automated test equipment protection from electro static discharge (ESD) events, said method comprising:
activating a disable signal of the ATE;
the activated disable signal driving to the reference potential a first and a second ESD rail of an ESD protection circuit, wherein the first and second ESD rail are AC coupled to a reference potential and coupled to the protected circuit; and
accessing a device under test (DUT) operable to be coupled to the protected circuit;
the ESD protection circuit operable to shunt to the reference potential via the first and second ESD rails an ESD event receivable on a signal rail coupled to the protected circuit.

21. The method of claim 20, wherein when a user is finished with disable mode, and initiates a request to resume testing as indicated by a low value of the disable signal of the ATE, the PE circuitry can be reprogrammed to appropriate levels, as well as the ESD rails reprogrammed to appropriate voltages.

22. The method of claim 20, wherein the protected circuit is powered up during the time the disable signal is active.

* * * * *